Figure 1:
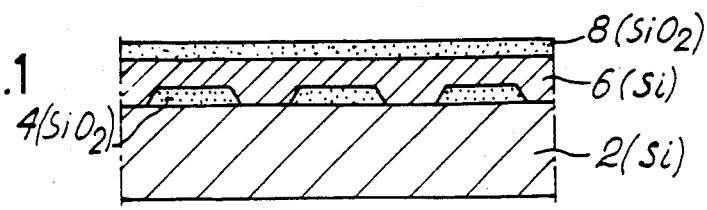

United States Patent [19]
Haond et al.

[11] Patent Number: 4,725,561
[45] Date of Patent: Feb. 16, 1988

[54] PROCESS FOR THE PRODUCTION OF MUTUALLY ELECTRICALLY INSULATED MONOCRYSTALLINE SILICON ISLANDS USING LASER RECRYSTALLIZATION

[76] Inventors: Michel Haond, 5 Rue de l'Oisans, 38240 Meylan; Jean Pierre Colinge, BP98, 38243 Meylan Cedex; Daniel Bensahel, 6 rue Colbert, 38000 Gremble; Didier Dutartre, 4 Alleédu Bret, 38240 Meylan, all of France

[21] Appl. No.: 882,901
[22] PCT Filed: Oct. 1, 1985
[86] PCT No.: PCT/FR85/00270
§ 371 Date: Jun. 5, 1986
§ 102(e) Date: Jun. 5, 1986
[87] PCT Pub. No.: WO86/02198
PCT Pub. Date: Apr. 10, 1986

[30] Foreign Application Priority Data
Oct. 5, 1985 [FR] France ................... 84 15302

[51] Int. Cl.[4] ................ H01L 21/263; H01L 21/76; H01L 21/95
[52] U.S. Cl. .................... 437/62; 437/68; 437/92; 437/69; 437/247; 156/628; 156/643; 156/657; 156/644; 357/49; 357/56
[58] Field of Search ............ 29/576 E, 576 W, 576 T; 148/1.5, 175; 156/628, 643, 657, 644; 357/49, 56, 2; 427/86

[56] References Cited
U.S. PATENT DOCUMENTS

| | | | |
|---|---|---|---|
| 4,233,091 | 11/1980 | Kawabe | 148/175 |
| 4,319,954 | 3/1982 | White et al. | 156/628 |
| 4,323,417 | 4/1982 | Lam | 156/613 |
| 4,497,683 | 2/1985 | Celler et al. | 156/603 |
| 4,507,158 | 3/1985 | Kamins et al. | 148/175 |
| 4,519,128 | 5/1985 | Chesebro et al. | 29/576 W |
| 4,523,962 | 5/1985 | Nishimura | 148/1.5 |
| 4,542,580 | 9/1985 | Delivorias | 29/590 |
| 4,545,823 | 10/1985 | Drawley | 148/1.5 |
| 4,565,584 | 1/1986 | Tamura et al. | 148/1.5 |

OTHER PUBLICATIONS

J. P. Colinge et al., "Use of Selective Annealing for Growing . . . .", Appl. Phys. Lett., 41(4), 15 Aug. 1982, pp. 346-347.
G. K. Celler et al., "Seeded Oscillatory Growth of Si over SiO$_2$ . . . ", Appl. Phys. Lett., 40(12), 18 Jun 1982, pp. 1043-1045.
S. Akiyama et al., "Multilayer CMOS Device Fabricated on Laser Recrystallized . . . ", IEDM 1983, pp. 352-353.
K. Smith, "Britain Getting Its Act Together in SOI Technology". . . . Electronics week, 6 Aug. 1984, pp. 31-33.

Primary Examiner—Brian E. Hearn
Assistant Examiner—William Bunch
Attorney, Agent, or Firm—Oblon, Fisher, Spivak, McClelland & Maier

[57] ABSTRACT

This process consists of producing patterns (17) of an insulating material on a monocrystalline silicon substrate (12), depositing on the complete structure an amorphous or polycrystalline silicon film (26), covering the latter with a layer (28) of an encapsulating material, carrying out a heat treatment on the structure obtained serving to vertically embed in substrate (12) the insulating material patterns (17) and forming above the latter a monocrystalline silicon layer (33), eliminating the encapsulating material layer (28) and etching the monocrystalline silicon layer obtained (33), so as to form said islands (34).

17 Claims, 14 Drawing Figures

PROCESS FOR THE PRODUCTION OF MUTUALLY ELECTRICALLY INSULATED MONOCRYSTALLINE SILICON ISLANDS USING LASER RECRYSTALLIZATION

The present invention relates to a process for the production of mutually electrically insulated monocrystalline silicon islands. It more particularly applies to the field of producing bipolar or MOS integrated circuits of the silicon on insulant type, in which components operating under "high voltage" must be electrically insulated from components operating under "low voltage".

The silicon on insulant technology used for producing mutually insulated monocrystalline silicon islands constitutes a significant improvement compared with the standard methods in which the active components of integrated circuits are directly produced on a solid silicon monocrystalline substrate. Thus, the use of an insulating material leads to a considerable decrease in the stray capacitances between the source and the substrate on the one hand and the drain and the substrate on the other of the active components of the integrated circuit and consequently to an increase in the operating speed of said circuit. It also leads to a significant simplification in the production processes, an increase in the integration density and a better behaviour of the circuit to high voltages.

One of the presently known methods for producing a monocrystalline silicon layer on an insulating support is diagrammatically shown in longitudinal sectional form in FIG. 1. This technology consists of forming on a type n or p monocrystalline silicon substrate 2, silicon oxide patterns 4 and then forming by gaseous phase deposition a thick polycrystalline silicon layer 6 surmounting said oxide patterns. On the complete polycrystalline silicon layer 6 is then deposited an insulating silicon oxide layer 8, more particularly by a chemical gaseous phase deposition process (LPCVD).

The following stage consists of recrystallizing the polycrystalline silicon layer 6 in monocrystalline form. This recrystallization consists of melting the silicon of layer 6 by heating it through the oxide layer 8 by means of a heating source. On cooling, the silicon layer 6 recrystallizes in monocrystalline form from the substrate 2, which then acts as a germ for growth. Mutually insulated monocrystalline silicon islands can then be produced in this monocrystalline silicon layer.

This process for obtaining a monocrystalline silicon layer on an oxide layer has in particular been described in an article in Materials research society symposia proceedings, vol 13, 1983 entitled "Lateral epitaxial growth of thick polysilicon films on oxidized three inch wafers" by G. K. Celler et al, pp 575 to 580.

This process suffers from a certain number of disadvantages. In particular, the surface of the recrystallized silicon layer 6 has an often significant roughness and the surface of the recrystallized zones on the oxide patterns 4 is not planar. These surface states impose a supplementary stage of polishing the surface of the recrystallized layer 6. Moreover, this process has a only a limited efficiency. Thus, the ratio of the zones recrystallized on insulant to the unused zones per silicon wafer is approximately 50%. Moreover, this process uses an epitaxy deposit of the silicon layer to be recrystallized, which generally takes a long time and is difficult to carry out. Finally, the alignment of the future resin masks for producing the components above the insulating patterns 4 is difficult to obtain by photolithography, because the recrystallized silicon of layer 6 is no longer transparent in the irradiation range generally used for the alignment of the masks.

The present invention relates to a process for the production of mutually electrically insulated monocrystalline silicon islands making it possible, inter alia, to obviate the aforementioned disadvantages.

According to the invention, the production process comprises the following successive stages:
(a) producing patterns of a first insulating material on a monocrystalline silicon substrate,
(b) depositing a thin silicon film on the complete structure,
(c) covering the silicon film with a layer of an encapsulating material,
(d) carrying out a heat treatment on the structure obtained for vertically embedding in the substrate the patterns of the first insulating material and for forming above said embedded or buried patterns a monocrystalline silicon layer,
(e) eliminating the encapsulating material layer and
(f) etching the monocrystalline silicon layer obtained so as to form said islands.

The silicon film can be a polycrystalline silicon film or an amorphous silicon film.

The process of the invention more particularly makes it possible to obtain mutually insulated monocrystalline silicon islands, which are free from any crystalline defects. Moreover, the surface of the monocrystalline silicon layer obtained is smooth and planar and in particular above the insulating patterns, which makes it possible obviate, compared with the prior art, a supplementary stage of polishing the surface of said monocrystalline layer. This advantage is increased in the variant of the invention in which the thin silicon film deposited is a thin amorphous silicon film, because such a film has an excellent surface state (smooth surface).

Furthermore, the wafer efficiency of this process is higher than in the prior art, the ratio of recrystallized on insulant zones to the unused zones being close to 80%. Preferably, the patterns of the first insulating material are in the form of continuous parallel strips, which are regularly spaced from one another.

Advantageously the heat treatment consists of on the one hand heating the face of the silicon substrate opposite to the silicon film in a uniform manner to a temperature below the silicon melting temperature and on the other hand the silicon film by means of an elongated heating source, the heating of the film being carried out by performing a relative sweep between the heating source and the film these simultaneous heating operations of the film and the substrate face bringing about a melted silicon zone moving over the entire surface of the film and the substrate.

In the case of first insulating material patterns in the form of parallel strips, the relative sweep between the source and the silicon film takes place in a direction parallel to said strips. This makes it possible to prevent any minor lateral displacements of the first insulating material patterns, when the latter are embedded in the monocrystalline substrate.

According to a first embodiment of the process according to the invention, stage (f) is performed in the following way:
producing a mask on the silicon layer obtained having the image of the first insulating material patterns, elimination of the unmasked silicon layer regions up to the level of the first insulating material patterns embedded in the substrate and elimination of the mask.

According to another procedure for performing the inventive process, following stage (f), the edges or flanks of the islands and regions of the substrate exposed between said islands are covered with a layer of a second insulating material.

Advantageously, following stage (f), the spaces between the islands are filled by a third material, which is preferably a polyimide resin.

Other features and advantages of the invention can be gathered from the following description given in an illustrative and non-limitative manner with reference to the attached drawings, wherein show:

FIG. 1, already described, diagrammatically and in longitudinal section illustrates the different stages of a process for producing a monocrystalline silicon layer according to the prior art, in which silicon islands can be produced.

FIGS. 2, 3, 8 to 14, diagrammatically and in longitudinal section the different stages of the process according to the invention.

Figure 4:
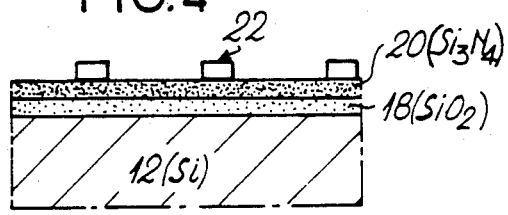
Figure 5:
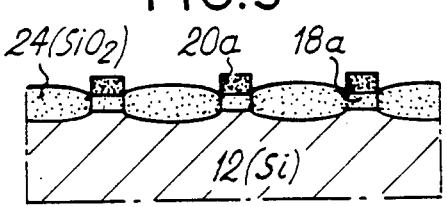
Figure 6:
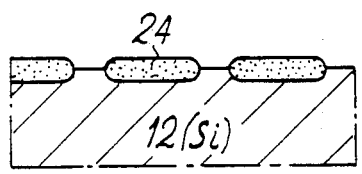

FIGS. 4 to 6, diagrammatically a variant of this process.

Figure 7:
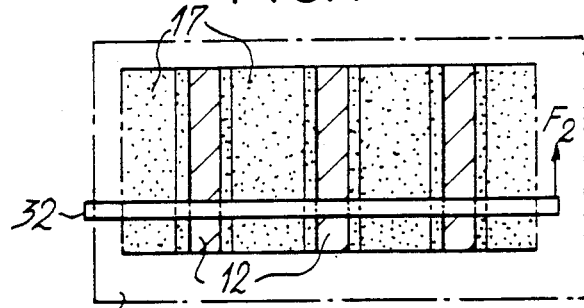

FIG. 7, diagrammatically an apparatus making it possible to perform the process according to the invention.

The first stages of the process consist of producing insulating material patterns (FIGS. 3 and 6) on a monocrystalline silicon substrate.

Figure 2:
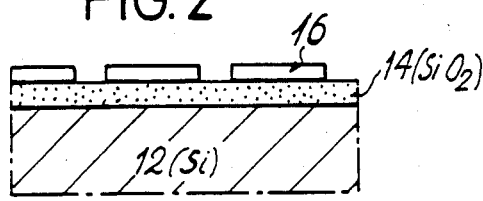

For this purpose and according to a first variant shown in FIG. 2, a type n or p monocrystalline silicon substrate 12, e.g. constituted by a silicon wafer cut along crystallographic plane 100, is covered with a layer 14 of a first insulating material, preferably constituted by silicon oxide. This insulating layer 12 can be obtained by thermal oxidation of substrate 12, under dry or wet oxygen at a temperature of approximately 800° to 1100° C., or deposited on the substrate by a chemical gaseous phase deposition process (pyrolysis at approximately 420° C. of $SiH_4$ and $O_2$). This oxide layer 14 e.g. has a thickness of approximately 1 $\mu$m.

A resin mask 16 is then produced on the silicon oxide layer 14 by conventional photolitograpy processes in order to define the dimensions of the oxide patterns to be produced in layer 14. In the manner shown in FIG. 3, this is followed by etching of the oxide layer 14, so as to expose the regions of the substrate not covered by mask 16. This etching can be carried anisotropically using a plasma etching process, or isotropically, e.g. by a chemical procedure using hydrofluoric acid as the etching agent. The structure shown in FIG. 3 results from a chemical-type etching.

This is followed by the elimination of mask 16, more particularly chemically or by etching an oxygen plasma. The insulating pattern obtained in this way on substrate 12 carry reference 17.

FIGS. 4 to 6 show another variant of the patterns in insulating material on substrate 12. As shown in FIG. 4, there is firstly a thermal oxydation of substrate 12, under oxygen and at a temperature of approximately 1000° C., so as to obtain a silicon oxide layer 18. Oxide layer 18 has a thickness of approximately 60 nm.

On said oxide layer 18 is then deposited an insulating layer 20, more particularly of silicon nitride, using a low pressure chemical vapour phase deposition process (pyrolysis of $NH_3 + SiH_2CL_2$ at 800° C.). This layer has a thickness of approximately 80 nm. This layer will subsequently serve as a mask for defining the dimensions of the insulating material patterns placed over the substrate.

On the nitride layer 20 is then formed a resin mask 22, which is complementary to mask 16 (FIG. 2) making it possible to define within the nitride layer 20 complementary patterns 2a (FIG. 5) with respect to those to be obtained on substrate 12. This is followed by the elimination of the regions of the nitride layer 20 which are not masked, so as to expose the underlying regions of the silicon oxide layer 18. This elimination can be carried out by an antisotropic or isotropic etching process and in particular by chemical etching using orthophosphoric acid as the etching agent, or by fluorine plasma etching.

With the aid of the etched nitride layer 20 and optionally mask 22, in the same way the oxide layer 18 is then etched until the substrate regions not covered by the etched layer 20 are exposed. The patterns produced in the oxide layer 18 carry the reference 18a (FIG. 5). This etching operation can be performed anisotropically or isotropically, e.g. by chemical etching using hydrofluoric acid as the etching agent. The structure obtained is shown in FIG. 5. The resin mask 22 can be eliminated chemically, using acetone as the etching agent.

The following stage of the process consists of thermally oxidizing the exposed substrate zones under dry or wet oxygen at a temperature between 800° and 1100° C. This thermal oxidation makes it possible to obtain oxide patterns 24, which are partly buried in substrate 12. This is followed by elimination, e.g. chemically using orthophosphoric acid of the remainder 20a of the nitride layer, followed by the elimination of the remainder 18a of the oxide layer, e.g. chemically using hydrofluoric acid. The structure obtained is shown in FIG. 6. This technology is generally known under the name LOCOS technology.

It is also possible according to the present invention to produce insulating patterns 24 which are completely buried in substrate 12 and following the etching of oxide layer 18 and silicon nitride layer 20 (FIG. 5), it is then merely necessary to etch over a certain height (close to 300 nm) the substrate regions not covered by the remainder 18a, 20a of the corresponding layers. This etching can be carried out isotropically and particularly chemically using a potassium solution.

Figure 3:
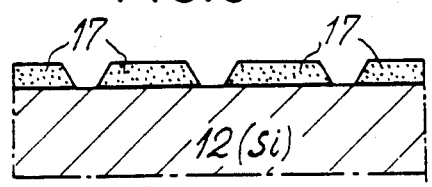

Advantageously, the oxide patterns 17 or 24, respectively produced on substrate 12 or buried therein, preferably have in the manner shown in FIG. 7 showing a plan view of the structure of FIG. 3, the form of continuous parallel strips, which are regularly spaced from one another and extend from one end to the other of substrate 12, or in other words the silicon wafer. These insulating strips 17 are uniformly distributed over the entire surface of substrate 12. For example, for a 100 mm$^2$ silicon wafer, it is possible to produce 10 to 20 $\mu$m wide insulating strips 17 with a reciprocal spacing of 4 $\mu$m.

The following stages of the process obviously relate to the insulating patterns 17 or 24 obtained on or in the substrate according to the previous above-described variants. However, in order to facilitate the following description, this will relate to the insulating patterns 17 obtained in an insulating layer by the etching thereof in accordance with the first variant described relative to FIGS. 2 and 3.

Figure 8:
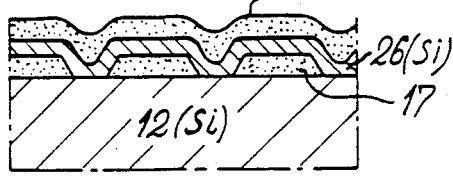

As shown in FIG. 8, on the complete structure is deposited a polycrystalline or amorphous silicon film 26, e.g. having a thickness of approximately 0.5 μm. The polycrystalline silicon film can be obtained by a low pressure chemical vapour phase deposition process at a temperature of approximately 600° C. by pyrolysis of $SiH_4$. In the same way, the amorphous silicon film can be obtained by low pressure, low temperature (below 550° C.) vapour phase deposition. Film 26 is then covered with an encapsulating layer 28, e.g. of silicon oxide, or silicon nitride, or even in multilayer form, a silicon oxide layer and a silicon nitride layer. Encapsulating 28 e.g. has a thickness of 1.5 to 2 μm and can be obtained by a low pressure chemical vapour phase deposition process at 430° C. by pyrolysis of $SiH_4+O_2$, when said layer is of silicon oxide.

Figure 9:
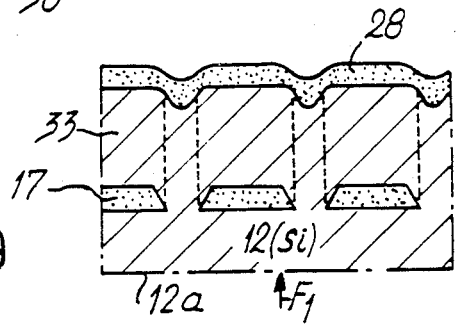

The following stage of the process consists of subjecting the structure obtained to heat treatment, which makes it possible to recrystallize the silicon layer 26 in monocrystalline form, as well as vertically embed in substrate 12 the oxide patterns 17. The structure obtained is shown in FIG. 9.

This heat treatment consists of heating substrate 12 from the rear, as shown by arrow $F_1$, i.e. face 12a of said substrate opposite to the silicon film 26. Substrate 12 is heated uniformly at a relatively high temperature, but which is below the melting temperature of the monocrystalline silicon constituting the substrate, i.e. a temperature of approximately 1300° C. This can e.g. be brought about by placing the substrate 12 on a graphite heating plate carrying reference 30 in FIG. 7.

Simultaneously with the heating of substrate 12, the silicon film 26 is heated through the encapsulating layer 28 using an elongated heating source 32, e.g. formed by a heated graphite bar (FIG. 7) or a focused linear lamp, or some other focused, linear energy beam. This heating of film 26 is carried out by effecting a relative sweep between source 32 and the sample and consequently film 26, e.g. by keeping the sample i.e. the film fixed and by moving source 32 over the entire sample surface, as indicated by arrows $F_2$.

It should be noted that substrate 12 can also be heated by using a set of linear lamps positioned parallel to the upper linear source 32.

These simultaneous heating operations of substrate 12 and silicon film 26 make it possible to bring about a molten silicon surface zone moving over the entire surface of the film and the substrate. Preferably and as shown in FIG. 7, source 32 is moved parallel to the insulating patterns 17, when the latter have the advantageous form of parallel continuous strips.

The depth to which the insulating patterns 17 can be embedded or buried can be accurately adjusted by acting on the sweep rate of source 32 and on the width of the moving molten surface zone, said width corresponding to the width corresponding to the width of source 32. For example a 5 mm wide source and with a displacement speed of 0.2 mm/s enables insulating patterns 17 to be buried to a depth of 20 μm in the substrate.

Such a heating apparatus has more particularly been described in the article In Journal of crystal growth, (63) 1983 entitled "Graphite strip-heater zone-melting recrystallization of Si films" by J. C. C. Fan et al.

Another heating apparatus usable in the invention is that described in French patent application 2532783 filed on Sept. 7, 1982 and which uses linear lamps focused on the side of the film.

The fact that the insulating patterns are buried vertically in the substrate, without any lateral displacement with respect to their initial position, makes it possible to localize then with respect to the surface of the sample which retains the initial relief and consequently makes it possible to bring about the alignment of the subsequent stages necessary for the production of the monocrystalline islands. This alignment is facilitated when the insulating patterns are obtained by the so-called LOCOS or buried LOCOS technology (FIG. 6).

The previously melted silicon above the buried insulating patterns 17 recrystallizes on cooling. It is free from any crystalline defect and has an absolutely planar and smooth surface. The monocrystalline silicon layer obtained surmounting the insulating patterns carries the reference 33.

Figure 10:
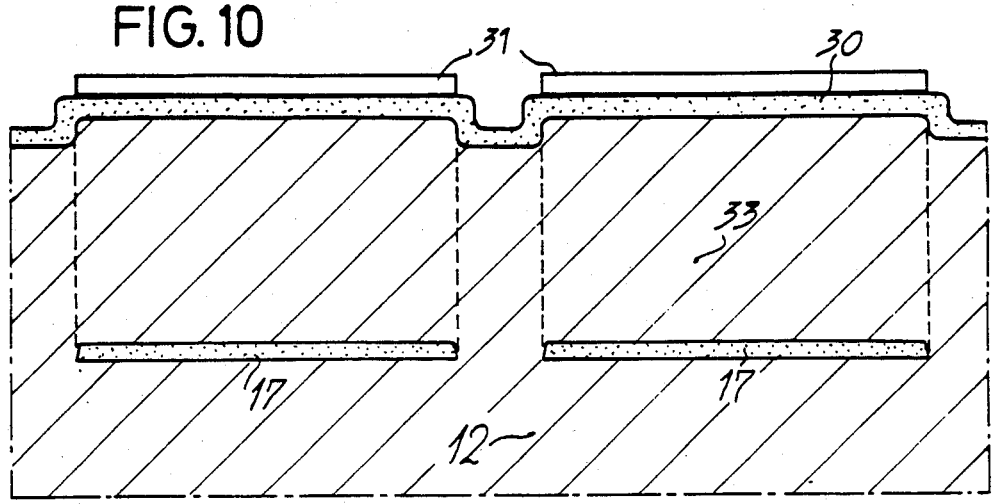

As shown in FIG. 10, the following stage of the process consists of eliminating the encapsulating layer 28, e.g. chemically in a hydrofluoric acid bath when said layer 28 is made from silicon oxide, or in an orthophosphoric acid bath, in the case of a silicon nitride layer.

The following stages of the process consist of etching the monocrystalline silicon layer 33 obtained above the oxide patterns 17 to form within said layer mutually insulated monocrystalline silicon islands.

As shown in FIG. 10, on the monocrystalline silicon layer 33 is firstly deposited a layer 30 of a material which is not sensitive to the etching agents for layer 33. This deposition can be carried out by a chemical vapour phase deposition process. As layer 30 has a thickness of approximately 100 nm, it can be formed from silicon oxide or silicon nitride.

Using conventional photolithography processes, on insulating layer 30 is then placed a resin mask 31 representing the image of the insulating patterns 33 embedded in the monocrystalline silicon and making it possible to mask said patterns. The fact that the monocrystalline silicon layer 33 has a relief corresponding to the relief prior to the embedding of the insulating patterns 17 makes it possible to correctly position the resin mask 32.

Figure 11:
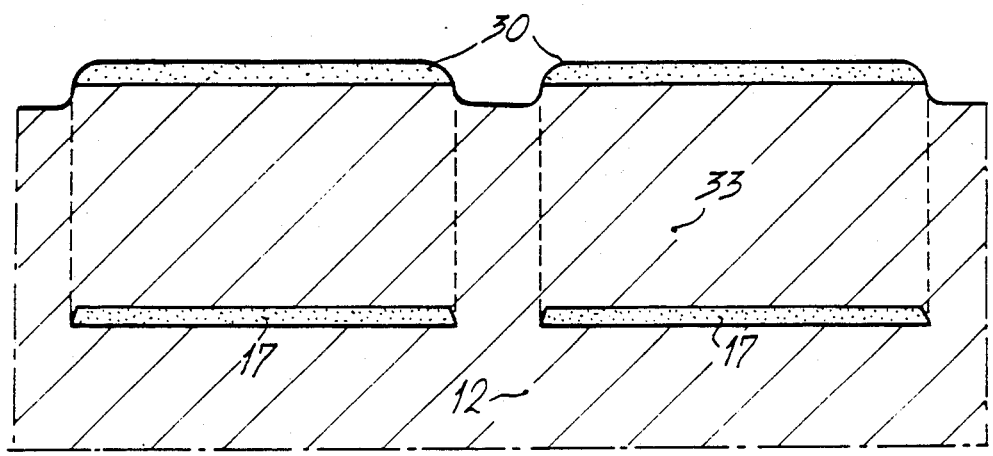

In the manner shown in FIG. 11, insulating layer 30 is then etched so as to eliminate the unmasked regions of layer 30 until monocrystalline layer 33 is exposed. This etching can be carried out isotropically adopting a chemical procedure, respectively using as the etching agent hydrofluoric or orthophosphoric acid for a silicon oxide or silicon nitride layer 30, or anisotropically using an oxygen plasma.

Figure 12:
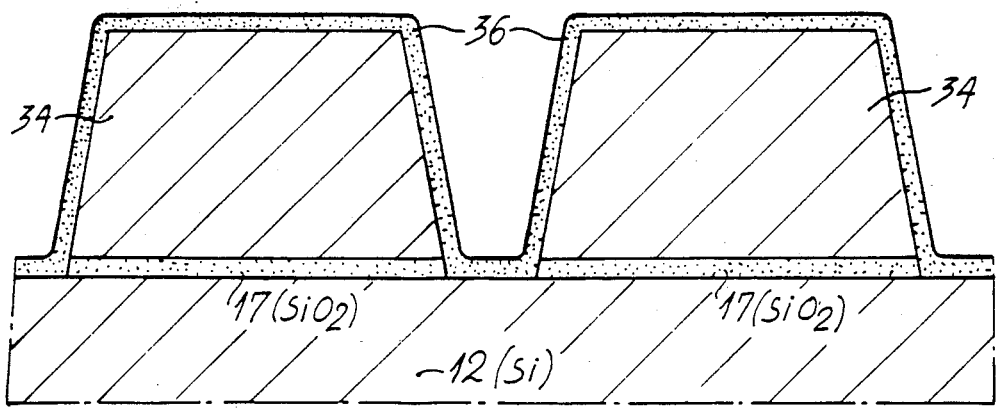

Following the elimination of the resin mask 31, more particularly chemically using acetone or nitric acid as the etching agent, in the manner shown in FIG. 12 the regions of the monocrystalline layer 33 free from the remainder of protective layer 30 are eliminated. This elimination can be carried out isotropically e.g. using a chemical etching process with a potassium solution as the etching agent. This etching is carried out up to the level of the insulating patterns 17, the flanks of said patterns being exposed. It makes it possible to obtain monocrystalline silicon islands 34, which are clearly separated from one another.

Following the etching of monocrystalline layer 33 and consequently the production of islands 34, the remainder of insulating layer 30 used as the mask for said etching operation can be eliminated, e.g. chemically using hydrofluoric acid in the case of a layer 30 made from silicon oxide or using orthophosphoric acid in the case of a layer 30 made from silicon nitride.

The following stage of the process consists of electrically and effectively insulating the monocrystalline islands 34 from one another. This insulation can be obtained by covering the structure obtained with an insulating layer 30, which can more particularly be of silicon oxide. This insulating layer 36 with a thickness of several hundred nanometers can be obtained by thermal oxidation under oxygen of the exposed regions of substrate 12, as well as the monocrystalline islands 34.

Figure 13:
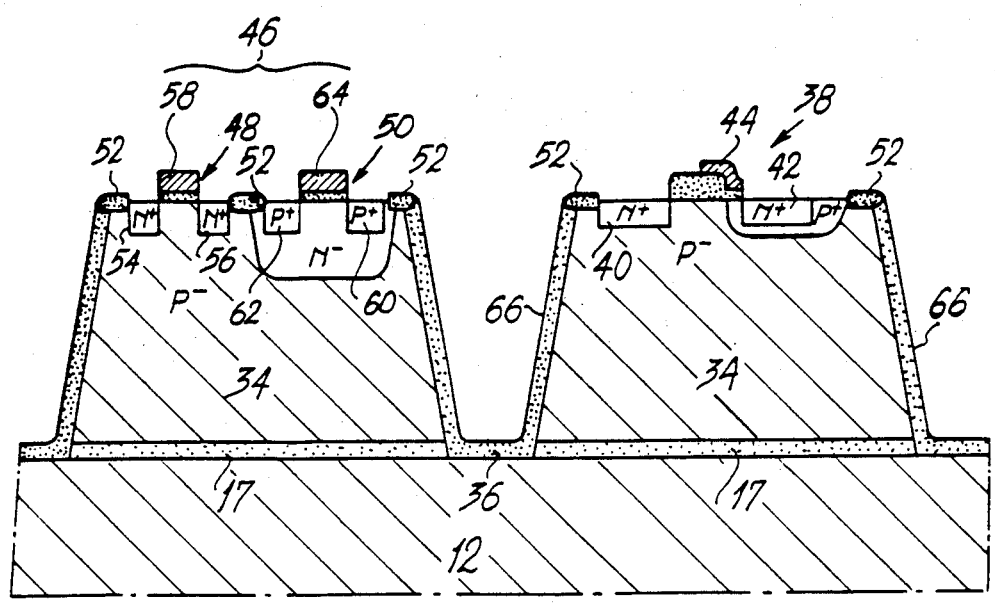

Oxide layer 36 can then be etched so as to only retain those portions of said layer located on the flanks of the monocrystalline islands 34 and on those regions of substrate 12 located between two contiguous islands. The structure resulting from this etching is shown in FIG. 13. As hereinbefore, the elimination of certain portions of the insulating layer 36 can be carried out by using a not shown mask covering the surface of the monocrystalline islands 34 and using an isotropic or anisotropic etching process, such as chemical etching with hydrofluoric acid.

In conventional manner, it is possible to then produce in the electrically mutually insulated monocrystalline islands 34, the active components of an integrated circuit and in particular the components operating under high voltage, such as bipolar or DMOS transistors, insulated from the components operating under low voltage, such as bipolar, CMOS or N-MOS transistors.

FIG. 13 shows a DMOS transistor 38 produced on a first monocrystalline island, which is provided in a conventional manner with a source 40 and a drain 42, diffused in said island, as well as a gate 44 insulated from the source and drain, as well as a CMOS inverter 46 produced on a second monocrystalline island formed from a N-channel transistor 48 and a P channel transistor 50, which are insulated from one another by a field oxide 52 obtained in the conventional way. In per se known manner, transistor 48 comprises a source 54, a drain 56 and a gate 58 insulated from the source and drain, whilst transistor 50 has a source 60, a drain 62 and a gate 64.

Figure 14:
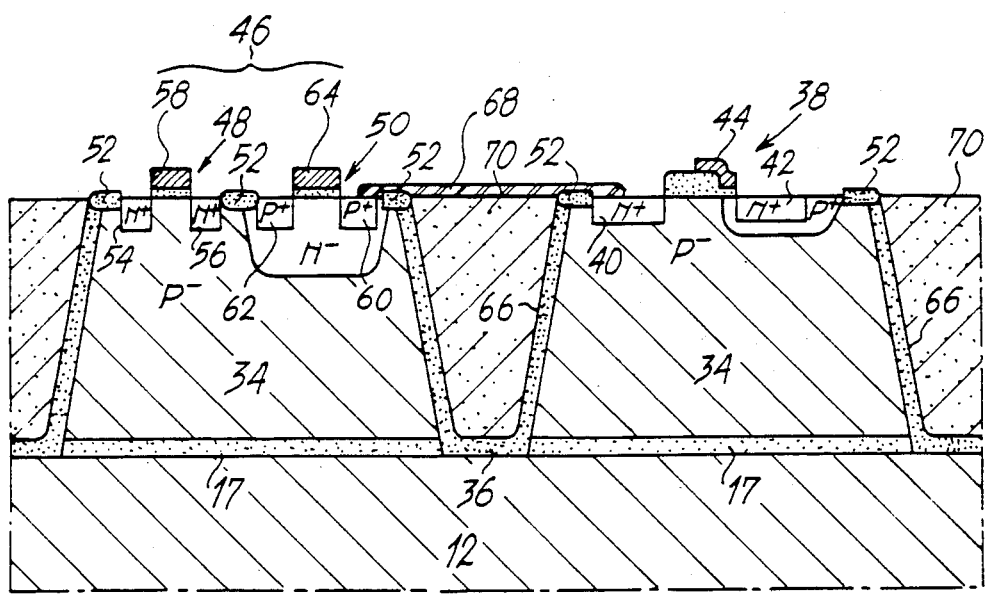

The different components produced in the monocrystalline silicon islands 34, such as CMOS inverter 46 and DMOS transistor 38 are produced in a conventional manner up to the metallization stage used for bringing about the interconnections of these components. Thus, prior to performing said metallization, the holes or spaces 66 between the different monocrystalline islands 34 are filled. As shown in FIG. 14, this filling can be carried out with a polyimide resin 68, which is deposited on the complete structure using a whirling means, followed by etching so as to eliminate those portions of said resin outside the spaces or holes 66. This elimination can be carried out by a reactive ionic etching process using a so-called planarization method.

The interconnections of the different components of the integrated circuit and in particular connection 70 between the low voltage CMOS component 46 and the high voltage DMOS component 38 can then be produced in a conventional manner. These interconnections are obtained by depositing on the complete structure a conductive layer, particularly of aluminium, with a thickness of 1 μm, followed by the etching of said layer so as to produce the different connections.

Obviously the above description has only been given in an illustrative manner. In particular, all modifications can be made with regards to the material of the material layers, their thickness, their deposition and etching processes.

We claim:

1. A process for producing mutually electrically insulated monocrystalline silicon islands, comprising in succession:
    (a) producing continuous parallel strips of a first insulating material on a monocrystalline substrate,
    (b) depositing a non-monocrystalline silicon film on the insulated substrate,
    (c) covering said deposited silicon film with a continuous layer of an encapsulating material,
    (d) subjecting the obtained structure to a heat treatment, thereby vertically embedding said parallel strips in the substrate and forming above said embedded strips a monocrystalline silicon film through said encapsulating layer by a heating means, whereby said heating is effected by sweeping said heating means in a direction parallel to said parallel strips, and said heating forming a molten silicon zone moving across the entire surface of the film, whereby said continuous parallel strips become embedded to the lower edge of said molten zone, said molten zone consisting essentially of said non-monocrystalline silicon layer and a portion of said substrate layer,
    (e) eliminating said encapsulating material layers, and
    (f) etching said monocrystalline silicon layer obtained, thereby forming said islands.

2. The process according to claim 1, wherein the non-monocrystalline silicon film is an amorphous silicon film.

3. The process according to claim 1, wherein the non-monocrystalline silicon film is a polycrystalline silicon film.

4. The process according to claim 1, wherein the continuous parallel strips are regularly spaced from one another.

5. The process according to claim 1, wherein the strips of the first insulating material are produced by covering the substrate with a layer of said first insulating material and then etching said layer until certain zones of said substrate are exposed.

6. The process according to claim 1, wherein the first insulating material strips are obtained by performing the following steps:
    (a) covering the substrate with at least one preliminary layer of insulating material,
    (b) etching said preliminary layer so as to produce in said layer patterns which are complementary to those to be obtained, and until certain substrate zones are exposed,
    (c) thermally oxidizing the exposed zones of said substrate, and
    (d) eliminating the remainder of the preliminary layer.

7. The process according to claim 6, wherein following step (b), the exposed substrate zones are partially etched.

8. The process according to claim 1, wherein the first insulating material is silicon oxide.

9. The process according to claim 1, wherein the encapsulating material layer is formed from a silicon oxide layer or a silicon nitride layer or a combination thereof.

10. The process according to claim 1, wherein the heat treatment comprises heating the face of the silicon substrate opposite to the silicon film in a substantially uniform manner and at a temperature below the silicon melting temperature.

11. The process according to claim 1, wherein step (f) comprises:
   (a) producing a mask on the silicon layer obtained, which represents an image of the strips of said first insulating material,
   (b) eliminating the regions of the silicon layer which have not been masked up to the level of the strips of the first insulating material embedded in said substrate, and
   (c) eliminating said mask.

12. The process according to claim 11, wherein the mask is made from silicon oxide or silicon nitride or a combination thereof.

13. The process according to claim 1, wherein after step (f), the flanks of the islands and the substrate regions exposed between said islands are covered with a layer of a second insulating material.

14. The process according to claim 1, which further comprises following step (f), filling spaces between said islands with a third material.

15. The process according to claim 14, wherein the filling of the spaces is carried out by depositing on the complete structure a layer of said third material and by eliminating the third material located outside of said spaces.

16. The process according to claim 14, wherein the third material is a polyimide resin.

17. The process according to claim 1, wherein the silicon film has a thickness of approximately 0.5 micrometers.

* * * * *

UNITED STATES PATENT AND TRADEMARK OFFICE
CERTIFICATE OF CORRECTION

PATENT NO. : 4,725,561

DATED : Feb. 16, 1988

INVENTOR(S) : Michel Haond, et al.

It is certified that error appears in the above-identified patent and that said Letters Patent is hereby corrected as shown below:    Title page:

--The Foreign Application Priority Data is recorded incorrectly.  It should read:

Oct. 5, 1984 [FR]  France .................... 84 15302

Signed and Sealed this

Ninth Day of August, 1988

Attest:

DONALD J. QUIGG

*Attesting Officer*        *Commissioner of Patents and Trademarks*